(12) United States Patent
Inaba et al.

(10) Patent No.: US 7,764,340 B2
(45) Date of Patent: Jul. 27, 2010

(54) OPTICAL INTERFERENCE FILTER THAT PERFORMS EXCELLENT COLOR SEPARATION, AND LIQUID CRYSTAL DISPLAY, ELECTROLUMINESCENCE DISPLAY AND PROJECTION DISPLAY APPARATUS HAVING THE OPTICAL INTERFERENCE FILTER

(75) Inventors: Yuichi Inaba, Osaka (JP); Takumi Yamaguchi, Kyoto (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 212 days.

(21) Appl. No.: 11/898,408

(22) Filed: Sep. 12, 2007

(65) Prior Publication Data

US 2008/0062359 A1  Mar. 13, 2008

(30) Foreign Application Priority Data

Sep. 12, 2006  (JP) ............................. 2006-246665

(51) Int. Cl.
*G02F 1/1335*  (2006.01)
(52) U.S. Cl. .................... 349/105; 349/104; 349/106
(58) Field of Classification Search .................. 349/14, 349/105, 106
See application file for complete search history.

(56) References Cited

FOREIGN PATENT DOCUMENTS

JP  9-15420  1/1997

*Primary Examiner*—K. Cyrus Kianni
(74) *Attorney, Agent, or Firm*—McDermott Will & Emery LLP

(57) ABSTRACT

An optical interference filter whose major component is a film member. The film member includes a plurality of window regions arranged discretely in a surface direction selectively transmit, using an effect of optical interference, light having a waveband that substantially belongs to a visible spectrum, the plurality of window regions being arranged discretely in the surface direction, and one or more boundary regions selectively transmit, using the effect of the optical interference, light having a waveband that substantially belongs to an invisible spectrum excluding the visible spectrum, the one or more the boundary regions being located between adjacent window regions.

4 Claims, 10 Drawing Sheets

B  G  R  B  G  R

OPTICAL INTERFERENCE FILTER THAT PERFORMS EXCELLENT COLOR SEPARATION, AND LIQUID CRYSTAL DISPLAY, ELECTROLUMINESCENCE DISPLAY AND PROJECTION DISPLAY APPARATUS HAVING THE OPTICAL INTERFERENCE FILTER

BACKGROUND OF THE INVENTION (1) Field of the Invention

The present invention relates to an optical interference filter used for a display device such as a liquid crystal display or a plasma display, and more particularly to a technique to improve efficiency of color separation.

(2) Description of the Related Art

In recent years, a multilayer optical interference filter has been prevalent as a color filter that can offer a stable characteristic with respect to heat resistance and light resistance while withstanding chemicals such as acid and alkaline. The multilayer optical interference filter realizes the performance of separating colors including red, green, blue and so on by the interference effect of laminated films, which are formed by thin films of inorganic compounds being laminated on each other.

FIG. 10 shows the structure of such a conventional color filter as described above.

This color filter is formed such that Titanium Dioxide ($TiO_2$) which is a high refractive index material and a Silicon Dioxide ($SiO_2$) which is a low refractive index material are alternately laminated on each other on a transparent substrate, then the optical film thickness is adjusted so that lights of color elements including red, green and blue are selectively transmitted.

Specifically, in order to selectively transmit lights that each have red, green and blue light wavebands, the above-described color filter generally has a thin-film multilayer structure in which the optical film thickness is optimized for each of the red, green, and blue light wavebands. For example, the total film thickness of each color part of the thin film multilayer is as follows: red (R): 1.5 μm, green (G): 1.9 μm, blue (B): 1.1 μm.

Here, for the sake of convenience, the parts of the thin film multilayer that selectively transmit red, green and blue lights are each referred to as red transmission region, green transmission region and blue transmission region.

In the above-described thin film multilayer, the film thickness of the blue transmission region is smaller than the green transmission region and the red transmission region. This is because the wavelength of blue light is shorter than the wavelengths of green and red lights. The film thickness of the blue transmission region is set to be small in order to set the light having a shorter wavelength in the blue transmission region to be the peak of transmittance.

Also, the film thickness of the green transmission region is particularly large since the thin-film multilayer structure of the red transmission region is combined with that of the blue transmission region to obtain a spectral characteristic of transmitting only the green waveband light.

The above-described color filter, which is formed by thin films of inorganic compounds being laminated on each other, even when used as the color filter of a color liquid crystal projector, exhibits less deterioration caused by heat generated from the intense light source of the projector and ultraviolet rays contained in the light source.

However, as described above, the total film thicknesses of the red transmission region, green transmission region, and blue transmission region are red (R): 1.5 μm, green (G): 1.9 μm, blue (B): 1.1 μm. For example, there is a 0.8 μm difference in film thickness between the green transmission region and the blue transmission region, and there is a 0.4 μm difference in film thickness between the red transmission region and the blue transmission region. Therefore, light that has entered obliquely in a transmission region may also enter an adjacent transmission region.

In this case, a so-called "color mixing" in which two or all colors out of the three primary colors are mixed together occurs and the color separation efficiency deteriorates.

In order to suppress the color mixing caused by oblique light that is transmitted through two transmission regions whose filter characteristics are different from each other, a functional part that blocks light, namely, a black matrix may be arranged in the boundary region of the two adjacent transmission regions. However, the black matrix is generally arranged away from the boundary region in the thickness direction of the filter. Therefore, it is not effective to prevent the color mixing that occurs in the part that spans between the adjacent transmission regions.

When the black matrix is formed, a method that laminates a light shielding material such as chromium (Cr), nickel (Ni), or a metallic oxide is used. If the light shielding material is attempted to be formed in the boundary region, namely, the part that spans between the adjacent transmission regions, the conventional manufacturing facilities cannot be used as they are, thereby increasing cost. Also, from a technical standpoint, a secondary problem such as an increase of a distance between pixels may arise.

SUMMARY OF THE INVENTION

In view of the above-described problems, a first object of the present invention is to provide an optical interference filter that prevents the color mixing caused by oblique light being transmitted through two transmission regions whose filter characteristics are different from each other.

A second object of the present invention is to provide a liquid crystal display having the optical interference filter that prevents the color mixing caused by the oblique light.

A third object of the present invention is to provide an electroluminescence display having the optical interference filter that prevents the color mixing caused by the oblique light.

A fourth object of the present invention is to provide a projection display apparatus having the optical interference filter that prevents the color mixing caused by the oblique light.

In order to achieve the first object, the present invention provides an optical interference filter including a film member, wherein a plurality of window regions arranged discretely in a surface direction selectively transmit, using an effect of optical interference, light having a waveband that substantially belongs to a visible spectrum, and one or more boundary regions selectively transmit, using the effect of the optical interference, light having a waveband that substantially belongs to an invisible spectrum excluding the visible spectrum, the one or more boundary regions being located between adjacent window regions. Also, the present invention provides 2) an optical interference filter that receives light including visible light, comprising: a transparent substrate; and a film member that has been formed on the transparent substrate, that selectively transmits lights having at least two different specific wavebands from among wavebands of incident light, and that has a multilayer structure composed of (i) two λ/4 multilayers, λ being of a wavelength that is substantially in a center of an overall distribution range of the wavebands transmitted through the plurality of window regions, each of the λ/4 multilayers including a plurality of dielectric layers whose optical film thickness is λ/4 each, and (ii) a spacer layer whose optical film thickness is different from λ/4, the spacer layer being sandwiched between the λ/4 multilayers.

Also, in order to achieve the second object, the present invention provides 3) a liquid crystal display comprising: a luminous unit operable to emit light including visible light; a liquid crystal layer having a plurality of first window regions whose states are each selectively switched between a light-transmitting state that transmits light emitted from the luminous unit and a light-shielding state that shields the light; and an optical interference filter having a plurality of second window regions arranged over the plurality of first window regions, one or more boundary regions existing between adjacent second regions, and a film member that, using an effect of optical interference, selectively transmits, in the second window regions, light having a waveband that substantially belongs to a visible spectrum, and that, using the effect of the optical interference, selectively transmits, in the boundary region, light having a waveband that substantially belongs to an invisible spectrum excluding the visible spectrum.

Also, in order to achieve the third object, the present invention provides 4) an electroluminescence display comprising: a luminescent layer having a plurality of light-emitting regions arranged discretely in a surface direction, each of the plurality of light-emitting regions selectively emitting light including visible light; and an optical interference filter having a plurality of window regions arranged over the plurality of light-emitting regions, one or more boundary regions existing between adjacent window regions, and a film member that, using an effect of optical interference, selectively transmits, in the window regions, light having a waveband that substantially belongs to a visible spectrum, and that selectively transmits, using an effect of optical interference, in the boundary region, light having a waveband that substantially belongs to an invisible spectrum excluding the visible spectrum.

Also, in order to achieve the fourth object, the present invention provides 5) a thin-model projection display apparatus comprising: a light source that emits light including visible light; an ultramicroscopic reflecting mirror semiconductor on which a plurality of mirrors that each change angles are arranged; and an optical interference filter that is arranged between the light source and the ultramicroscopic reflecting mirror semiconductor, and that has a plurality of window regions, one or more boundary regions existing between adjacent window regions, and a film member that, using an effect of optical interference, selectively transmits, in the window regions, light having a waveband that substantially belongs to a visible spectrum, and that, using an effect of optical interference, selectively transmits, in the boundary region, light having a waveband that substantially belongs to an invisible spectrum excluding the visible spectrum.

With the above-described structure 1), when visible light enters the boundary region, a waveband that substantially belongs to an invisible region excluding a visible region, is transmitted due to an optical interference, and a waveband in the visible region is not easily transmitted.

In other words, a film member in the boundary region functions as if the film member were a black matrix that blocks light. Therefore, visible light that has entered obliquely is less likely to leave the boundary region, thereby preventing the visible light from reaching the adjacent window regions.

Consequently, color mixing of lights that are transmitted through adjacent window regions is suppressed.

Also, with the above-described structure 2), the film member can be thinner.

As a result, even though light enters the above-described film member obliquely, the film member causes an element of the light that moves along the direction of a substrate surface to be reduced. Therefore, color mixing is less likely to occur, and efficiency of color separation is improved.

Also, an optical interference filter having the above-described structure 1) can be adopted for the liquid crystal display described in the above 3), the electroluminescence display described in the above 4), and the thin-model projection display apparatus 5). Needless to say, these displays achieve the same effect as the optical interference filter described in the above 1).

Also, in the structure described in the above 1), it is preferable to have a structure described as follows.

Preferably, the waveband of the light that is transmitted through the window region corresponds to any one of light colors red, green, and blue.

With the above-described structure, the film member can be thinner. Therefore, even though light enters the film member obliquely, the film member causes the amount of the light that moves along the direction of a substrate surface to be reduced. Furthermore, color mixing is less likely to occur, and efficiency of color separation is improved.

Also, it is preferable that the film member has a multilayer structure composed of (i) two λ/4 multilayers, λ being of a wavelength that is substantially in a center of an overall distribution range of the wavebands transmitted through the plurality of window regions, each of the λ/4 multilayers including a plurality of dielectric layers whose optical film thickness is λ/4 each, and (ii) a spacer layer whose optical film thickness is different from λ/4, the spacer layer being sandwiched between the λ/4 multilayers. Also, when the two λ/4 multilayers and the spacer layer are respectively referred to as a first λ/4 multilayer, a second λ/4 multilayer, and a first spacer layer, it is preferable that the film member further includes a third λ/4 multilayer and a second spacer layer, and the second spacer layer is sandwiched between the second λ/4 multilayer and the third λ/4 multilayer.

With the above-described structure, a structure of layers with the thickness of substantially the wavelength of incident light (up to 500 nm) can perform color separation. Therefore, a light filter can be formed thinner and the deterioration of color separation function due to the oblique light can be suppressed.

Also, the structure described in the above 2) preferably has the structure described below.

The film member has a plurality of window regions arranged discretely in a surface direction and one or more boundary regions located between adjacent window regions, a waveband of light that is transmitted through the window region corresponds to any one of light colors red, green, and blue, and a waveband of light that is transmitted through the boundary region substantially belongs to an invisible spectrum excluding a visible spectrum.

With the above-described structure, visible light, namely, red light, green light, or blue light is not easily transmitted through the boundary region, thereby preventing so-called color mixing in which the lights of these colors are mixed together.

Also, when the two λ/4 multilayers and the spacer layer are respectively referred to as a first λ/4 multilayer, a second λ/4 multilayer, and a first spacer layer, it is preferable that the film member further includes a third λ/4 multilayer and a second spacer layer, and the second spacer layer is sandwiched between the second λ/4 multilayer and the third λ/4 multilayer.

With the above-described structure, layers whose thickness is substantially the wavelength of incident light (up to 500 nm) can perform color separation. Therefore, a light filter can be formed thinner and the deterioration of color separation function due to the oblique light can be suppressed.

BRIEF DESCRIPTION OF THE DRAWINGS

These and the other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENT

The following describes a first embodiment of the present invention, with reference to the attached diagrams.

First Embodiment

1. Structure

Figure 1:
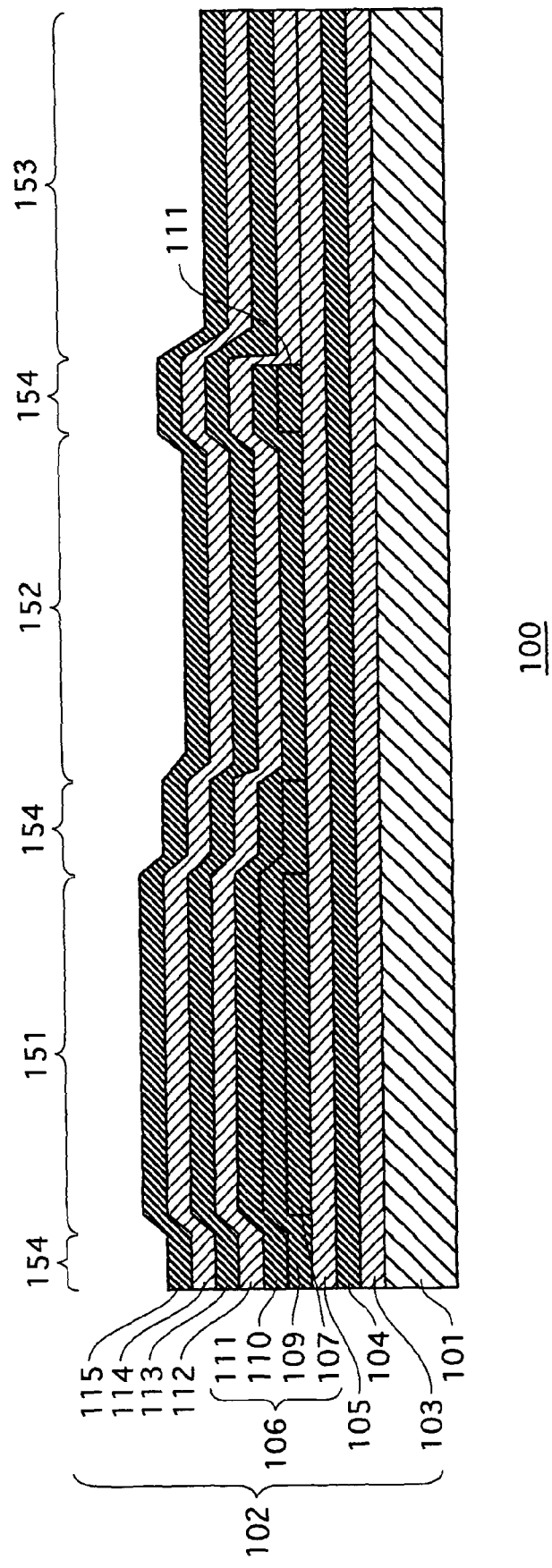
FIG. 1 is a local sectional view of an optical interference filter according to the first embodiment of the present invention.

FIG. 1 is a local sectional view of an optical interference filter 100 according to the first embodiment of the present invention.

The optical interference filter 100 separates colors of red, green, and blue, and is formed such that, on a transparent substrate 101, a first high refractive index layer 103, a first low refractive index layer 104, a second high refractive index layer 105, a low refractive index composite layer 106, a third high refractive index layer 112, a second low refractive index layer 113, a fourth high refractive index layer 114, and a third low refractive index layer 115 are laminated on each other in the stated order. Also, the optical interference filter 100 is different from conventional optical interference filters that each include low refractive index layers and high refractive index layers simply laminated on each other. Instead, in the optical interference filter 100, the optical film thickness of the low refractive index composite layer 106 is considerably different from that of other layers.

In other words, all the layers other than the low refractive index layer 106 have substantially the same optical film thickness.

Here, the above-described optical film thickness means a value nd that is obtained by multiplying a refractive index n of a material of the layer by film thickness d of the layer.

The above-described low refractive index composite layer 106 is a so-called spacer layer, and is composed of a composite layer that is formed such that a plurality of layers made of a low refractive index material are laminated on each other while a position at which each layer is laminated is shifted. As shown in FIG. 1, the low refractive index composite layer 106 is formed of a forth low refractive index layer 107, a fifth low refractive index layer 109, a sixth low refractive index layer 110, and a seventh low refractive index layer 111 being laminated on each other.

Here, for the sake of convenience, all of the layers laminated on the transparent substrate 101, namely, the first high refractive index layer 103, the first low refractive index layer 104, the second high refractive index layer 105, the low refractive index composite layer 106, the third high refractive index layer 112, the second low refractive index layer 113, the fourth high refractive index layer 114, and the third low refractive index layer 115 are collectively referred to as a total multilayer 102.

In principle, the optical interference filter 100 is a multilayer type optical interference filter formed with use of a photonic crystal technique. In the photonic crystal technique, two kinds of materials having different refractive indexes are alternately laminated on each other with a thickness of substantially a quarter-wavelength of light, thereby forming a photonic band gap that blocks light having the above-described wavelength. Furthermore, as seen in the above-described low refractive index composite layer 106, part of the cyclic structure is destroyed to have a defect in order to form, in a reflection band, a bandwidth that transmits only light having a specific wavelength band.

As for the above-described two kinds of materials having different refractive indexes, Silicon Dioxide ($SiO_2$) is used as a low refractive index material, and Titanium Dioxide ($TiO_2$) is used as a high refractive index material.

Here, in the low refractive index composite layer 106, a region in the lamination direction of the optical interference filter 100 that includes the fourth low refractive index layer 107, the fifth low refractive index layer 109, and the sixth low refractive index layer 110 laminated on each other is referred to as a region 151 that transmits light having a wavelength corresponding to blue color (referred to as "blue transmission region" hereinafter).

Also, in the low refractive index composite layer 106, a region in the lamination direction of the optical interference filter 100 that includes only the sixth low refractive index layer 110 is referred to as a region 152 that transmits light having a wavelength corresponding to red color (referred to as "red transmission region" hereinafter).

Furthermore, in the low refractive index composite layer 106, a region in the lamination direction of the optical interference filter 100 that includes the fourth low refractive index layer 107 and the sixth low refractive index layer 110 is referred to as a region 154 that substantially belongs to transmits a near infrared ray and a near ultraviolet ray (referred to as "black matrix region" hereinafter).

This black matrix region 154 does not easily transmit visible light. In other words, the black matrix region 154 causes visible light to be reflected. Therefore, for humans who can only sense visible light, the black region 154 functions like a light shielding member such as a black matrix.

Also, on the surface of the transparent substrate 101, a region in the lamination direction of the optical interference filter 100 that does not include the low refractive index composite layer 106 is referred to as a region 153 that transmits light having a wavelength corresponding to green color (referred to as "green transmission region" hereinafter).

2. Optical Film Thickness Setting

Figure 2:
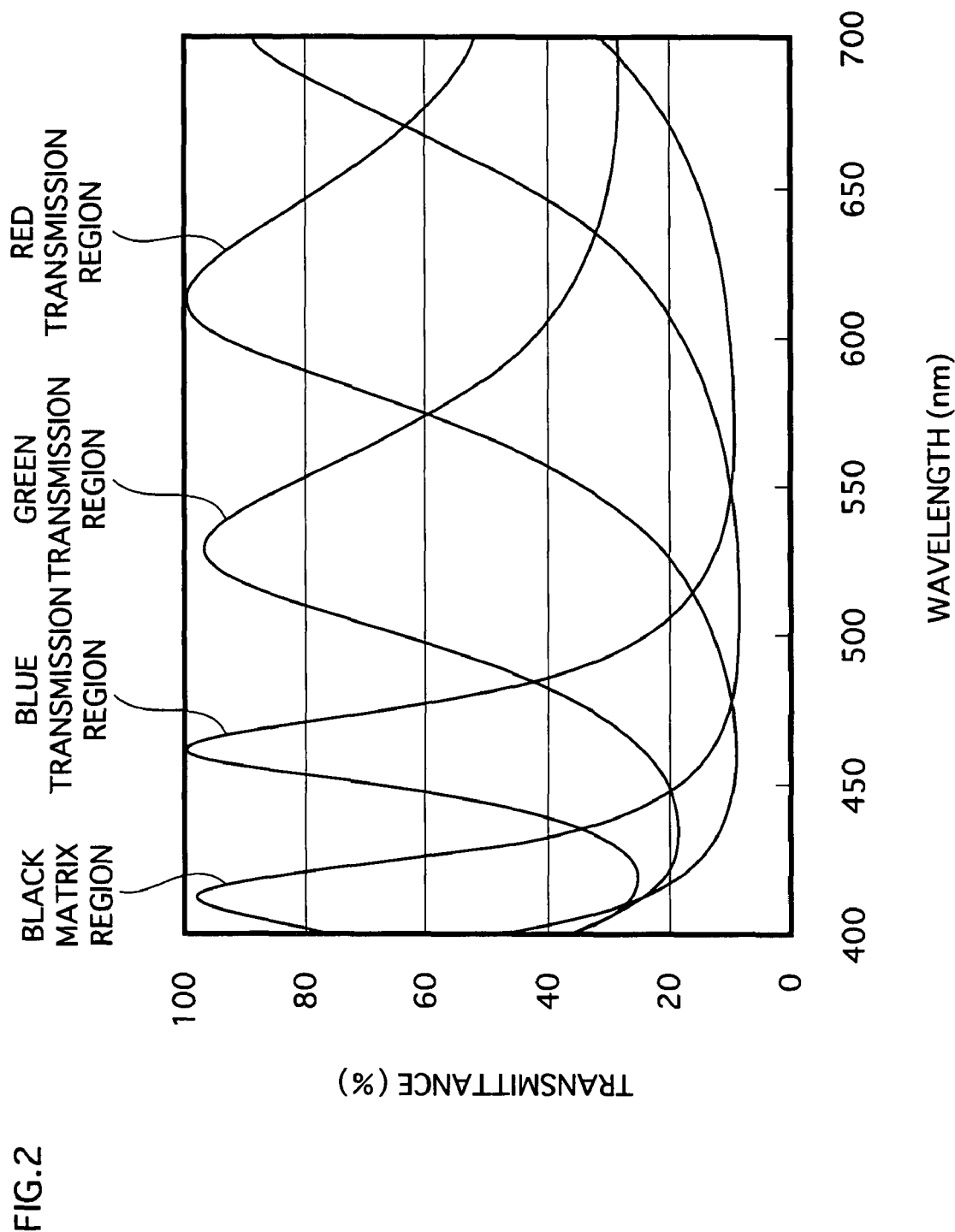
FIG. 2 is a diagram showing a spectral characteristic of the optical interference filter according to a first embodiment of the present invention.

FIG. 2 shows one example of design results of a spectral characteristic obtained by a calculation using a characteristic matrix method, which is widely known in the multilayer optical interference filter. Here, as dielectric materials, a high refractive index material $TiO_2$ (refractive index 2.5) and a low refractive index material $SiO_2$ (refractive index 1.45) are used to form the multilayer optical interference filter.

The optical film thicknesses of the low refractive index composite layer 106 are 0.188 µm, 0.044 µm, 0.000 µm (no films), and 0.133 µm in the blue transmission region 151, the red transmission region 152, the green transmission region 153, and the black matrix region 154 respectively. Also, the physical film thicknesses in each of the above-described regions are 0.130 µm, 0.030 µm, 0.000 µm (no films), and 0.091 µm respectively.

In other words, among the blue transmission region 151, the red transmission region 152, and the green transmission region 153, the part where difference in film thickness is the most significant is between the blue transmission region 151 and the green transmission region 153, and the difference is 0.13 µm.

In the color filter described in Patent Document 1, among the blue transmission region 151, the red transmission region 152, and the green transmission region 153, the part where difference in film thickness is the most significant is between the blue transmission region 151 and the green transmission region 153, and the difference is 0.800 µm. This concludes that the film thickness of the optical interference filter in the first embodiment is 0.67 µm smaller than that of the color filter in Patent Document 1, and the difference in film thickness has decreased by 83.7% as a ratio.

As shown in FIG. 2, the optical interference filter of the present invention can change a transmission peak wavelength characteristic by the change of the film thickness of the low refractive index composite layer 106. Also, the structure of the lamination-type optical interference filter can separate the wavelengths of red, green, and blue that are necessary in a color filter whose film thickness is thinner, and can further function as the black matrix.

Here, in the spacer layer that determines each of the spectral characteristics of the blue transmission region 151, the red transmission region 152, the green transmission region 153, and the black matrix region 154 respectively, the film thickness in each of the regions is set as described above because of the following reasons.

The optical film thickness of each layer in the optical interference filter is set to be 132.5 nm except the spacer layer. As shown in FIG. 2, this optical film thickness corresponds to 530 nm as a set wavelength.

In the green transmission region 153 that selectively transmits green, the film thickness of the spacer layer is set to be zero. In this case, as shown in FIG. 2, the transmission band is generated by centering on the set wavelength 530 nm.

Furthermore, when the thickness of the spacer layer increases from zero, the phase relation of light that enters λ/4 multilayers arranged at the top and bottom of the spacer layer relatively changes. As a result, the peak value shifts from 530 nm to a longer wavelength side.

For example, when the optical thickness of the spacer layer is set to be 30 nm, the region in the optical interference filter becomes the red transmission region 152 that transmits light having a wavelength corresponding to red color.

Furthermore, when the optical thickness of the spacer layer increases, a peak value of a transmission wavelength shifts from the visible region to the near infrared region, but the next peak wavelength appears simultaneously from the ultraviolet region.

Also, when the optical thickness of the spacer layer is set to be 130 nm, the next peak wavelength appears and functions as a blue filter.

Note that in the case of the optical interference filter including only the λ/4 multilayers, in other words, having no low refractive index composite layer 106, the filter has the characteristic that reflects light having a waveband that is in a range between two wavebands. One of the wavebands is away for a predetermined wavelength from a standard in the increase direction, and the other waveband is away for a predetermined wavelength from a standard in the decrease direction (referred to as "reflection waveband hereinafter). Here, the above-described standard is set to be the wavelength of the above-described λ.

When the transmission characteristic of the λ/4 multilayer is shown in a graph whose horizontal axis represents wavelength and whose vertical axis represents transmittance, the graph shows a bathtub curve whose symmetric axis is wavelength λ.

Generally, if a plurality of wavebands, for example, wavebands corresponding to the color blue, green, and red, are desired to be transmitted, from the perspective of a design, a value of λ is set to be a wavelength that is substantially in the center of an overall distribution range of the plurality of wavebands that are desired to be transmitted.

Note that, if only one waveband, for example, a waveband corresponding to the color blue, is desired to be transmitted, from the perspective of a design, a value of λ is set to be a wavelength that is substantially in the center of the waveband.

The low refractive index composite layer 106, namely, the spacer layer is provided between the above-described λ/4 multilayer, thereby adding a characteristic that only the light having a specific waveband out of the reflection waveband can be transmitted. The specific waveband is determined according to the optical film thickness of the spacer layer.

As described above, changing the film thickness of only some part of the dielectric layers out of the dielectric multilayer formed on the transparent substrate enables the spectral characteristic to be changed significantly. In other words, changing only some part of film thickness enables the color separation. As a result, the difference in film thickness between pixels can be smaller and thus the deterioration of color separation function caused by oblique light can be prevented.

Also, the black matrix region 154, which is formed between each pixel as a black matrix, can be formed on the same process as a color filter. Therefore, the productivity increases considerably, which helps to lower the cost.

Also, in FIG. 1, $TiO_2$ is used as a high refractive material. However, materials that are well-known as having a high refractive index such as Silicon Nitride (Sin), Tantalum Oxide ($Ta_2O_5$), Zirconium Oxide ($ZrO_2$) can be used instead of $TiO_2$. Also, $SiO_2$ is used as a low refractive material. However, it is acceptable to use another material other than $SiO_2$ as long as the refractive index of the material is lower than that of a dielectric material used as a high refractive material.

3. Manufacturing Method of Optical Interference Filter

The following describes the manufacturing method of the optical interference filter 100.

Figure 3:
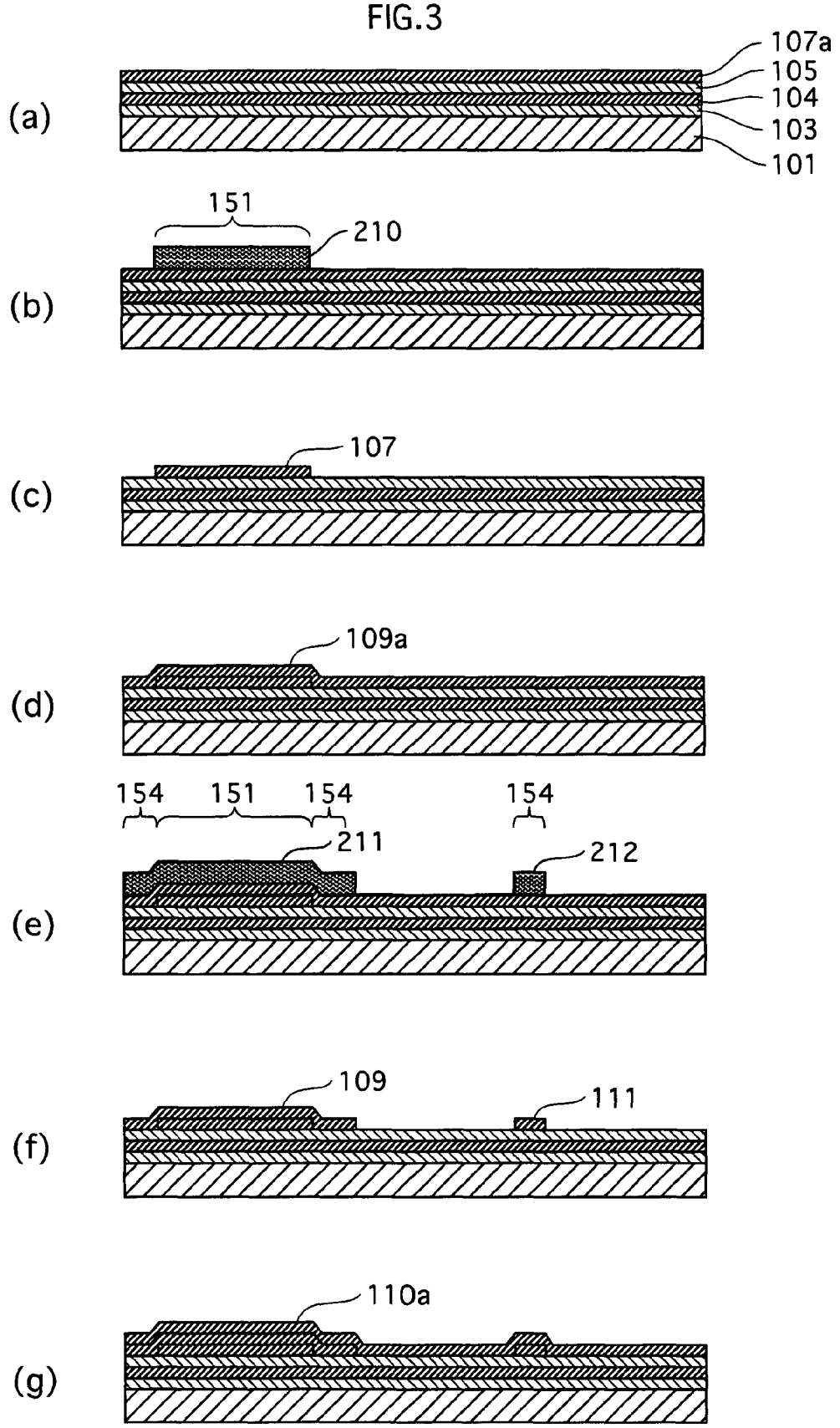
FIG. 3 is a diagram showing the manufacturing process of the optical interference filter according to the first embodiment of the present invention.
Figure 4:
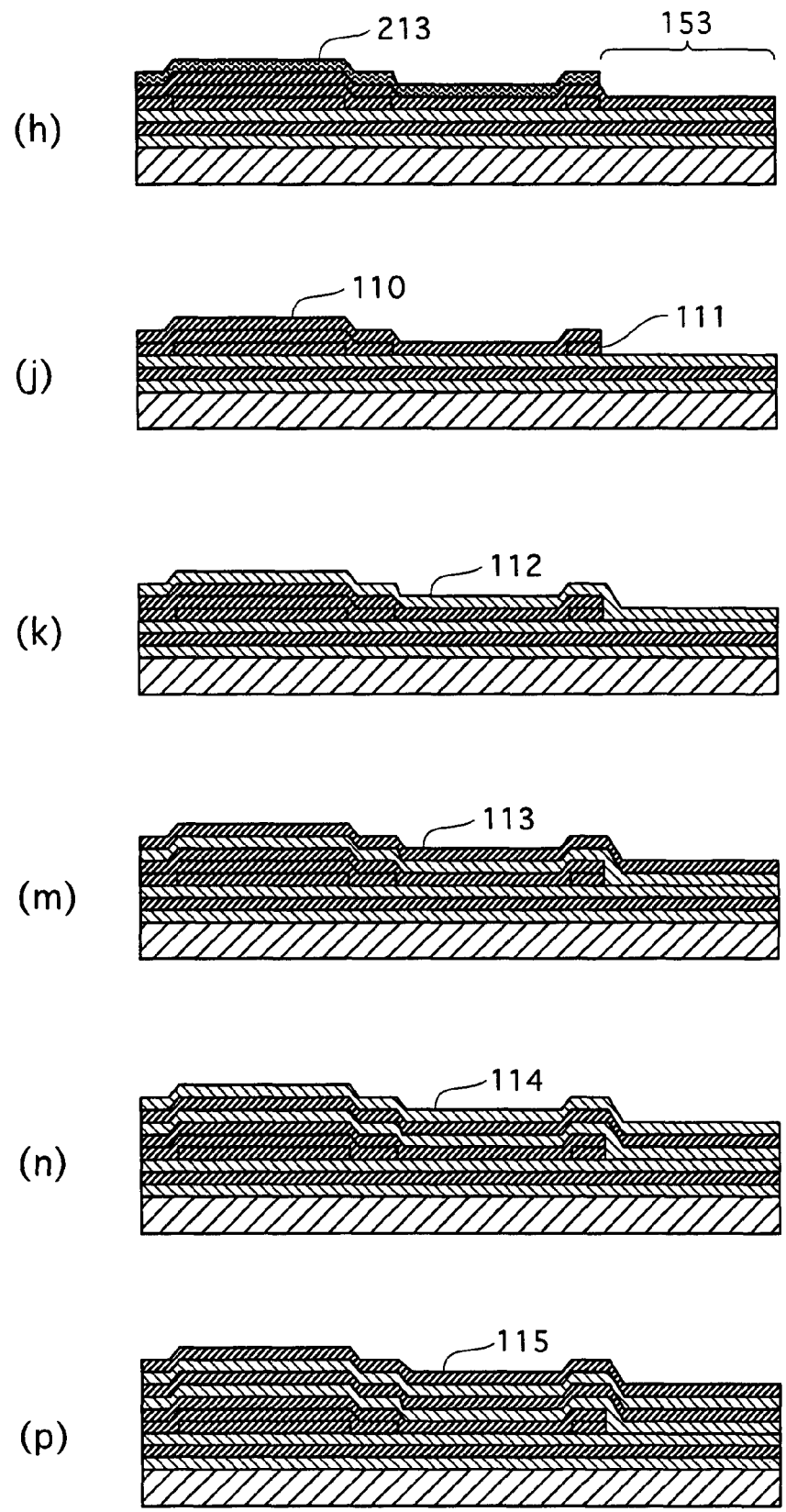
FIG. 4 is a diagram showing the manufacturing process of the optical interference filter according to the first embodiment.

FIG. 3 and FIG. 4 show the manufacturing process of the optical interference filter 100. The process is sequentially performed from FIG. 3(*a*) to FIG. 4(*p*).

Specifically, the optical interference filter 100 is formed as follows. First, as shown in FIG. 3(*a*), (i) the first high refractive index layer 103 that is made of Titanium Dioxide, (ii) the first low refractive index layer 104 that is made of Silicon Dioxide, and (iii) the second high refractive index layer 105 that is made of Titanium Dioxide are formed in the stated order on the transparent substrate 101 that is made of quartz to form a λ/4 multilayer. As for a method to form the λ/4 multilayer, a sputtering method using a high-frequency (RF: Radio Frequency) sputtering apparatus, or an evaporation method using an electron beam or resistance heating is used.

Furthermore, by using the sputtering method or the evaporation method, a fourth low refractive index intermediate layer 107*a* that is made of Silicon Dioxide is stacked on the second high refractive index layer 105.

Then, a resist precursor (not shown in figure) is applied in an area for the blue transmission region 151, which is formed on the fourth low refractive index intermediate layer 107*a*. Then, a heat treatment known as pre-bake, exposure using a photolithography device such as a stepper, development of the resist using an organic solvent and such, and a heat treatment known as post-bake are sequentially performed to form a resist 210 whose thickness is 1 μm in the area for the blue transmission region 151.

Subsequently, etching process is performed. In the process, exposed part of the fourth low refractive index intermediate layer 107*a*, namely, the film thickness of 39 nm in an area excluding the blue transmission region 151, is removed.

Specifically, as shown in FIG. 3(*c*), a gas of CF type is used to physically perform a dry etching on the fourth low refractive index intermediate layer 107*a*.

Etching conditions are described as follows.
(Etching Conditions)
Etching Gas: $CF_4$
Gas Flow Rate: 40 sccm
RF Power: 200 w
Vacuum: 0.050 Torr
(Others)

Silicon Dioxide and Titanium Dioxide have large selectivity with respect to Hydrofluoric Acid. Therefore, the etching is not limited to dry etching. Instead, wet etching process using Hydrofluoric Acid and such can also be adopted.

In the case that Hydrofluoric Acid is used for the process, it is preferable that the solution is made such that Hydrofluoric Acid and ammonium fluoride solution are mixed in the proportion of one to four.

Then, the layers are soaked in the mixed solution for five seconds to perform etching, and an organic solvent or the like is used to remove the resist.

In this way, as shown in FIG. 3(*c*), only the fourth low refractive index intermediate layer 107, which is the area for the blue transmission region 151, remains.

Next, as shown in FIG. 3(*d*), the fifth low refractive index intermediate layer 109*a* that is made of Silicide Dioxide is formed on the whole exposed surface using a high frequency sputtering apparatus.

Here, the film thickness of the fifth low refractive index intermediate layer 109*a* to be formed is 61 nm.

Then, as shown in FIG. 3(*e*), a resist 211 and a resist 212 are formed in the blue transmission region 151 and the black matrix region 154 respectively to perform etching process on the fifth low refractive index intermediate layer 109*a* except the regions for the blue transmission region 151 and for the black matrix region 154.

As shown in FIG. 3(*f*), after the above-described process is performed, the fifth low refractive index layer 109 is formed in the blue transmission region 151 and the black matrix regions 154 that are arranged at both ends of the blue transmission region 151. Also, a seventh low refractive index layer 111 is formed in the black matrix region 154 that is arranged between the red transmission region 152 and the green transmission region 153.

Then, as shown in FIG. 3(*g*), a sixth low refractive index intermediate layer 110*a* that is made of Silicon Dioxide is formed on the whole exposed surface using a high frequency sputtering apparatus.

Here, the film thickness of the sixth low refractive index intermediate layer 110*a* to be formed is 30 nm.

Next, as shown in FIG. 4(*h*), a resist 213 is formed on the exposed surface except the surface of the green transmission region 153.

Then, etching process is performed. In the process, the optical film thickness of 30 nm in the exposed part of the sixth low refractive index intermediate layer 110*a*, namely, the green transmission region 153, is removed.

With the above-described process, as shown in FIG. 4(*j*), the sixth low refractive index layer 110 is formed on the blue transmission region 151, the red transmission region 152, and all the black matrix regions 154.

After that, as shown in FIG. 4(*k*), the above-described sputtering method or the evaporation method is used to form, on the whole exposed surface, the third high refractive index layer 112 that is made of Titanium Dioxide.

Then, as shown in FIG. 4(*m*), the above-described sputtering method or the evaporation method is used to form, on the whole exposed surface, the second low refractive index layer 113 that is made of Silicon Dioxide.

Furthermore, as shown in FIG. 4(*n*), the above-described sputtering method or the evaporation method is used to form, on the whole exposed surface, the fourth high refractive index layer 114 that is made of Titanium Dioxide.

Finally, as shown in FIG. 4(*p*), the above-described sputtering method or the evaporation method is used to form, on the whole exposed surface, the third low refractive index layer 115 that is made of Silicon Dioxide.

When the above-described process has been completed, the physical film thicknesses of the low refractive index composite layer 106 in the blue transmission region 151, the red transmission region 152, the green transmission region 153, and the black matrix region 154 are 133.0 nm, 33.0 nm, 0.0 nm and 91 nm.

Note that the first high refractive index layer 103, the first low refractive index layer 104, the second high refractive index layer 105, the third high refractive index layer 112, the second low refractive index layer 113, the fourth high refractive index layer 114, and the third low refractive index layer 115 have a λ/4 multilayer structure in which the optical film thickness of each layer has been adjusted so that the layers obtain the optical characteristic shown in FIG. 2.

As described above, in the optical interference filter 100 of the first embodiment, (1) the black matrix regions 154, which prevent visible light from being transmitted, are each arranged in the area between adjacent regions among the blue transmission regions 151, the red transmission region 152, and the green transmission region 153 that function as a color filter. Therefore, even though oblique light enters in the blue transmission region 151, the red transmission region 152, and the green transmission region 153, the black matrix region 154 blocks visible light and prevents color from being mixed.

Furthermore, the manufacturing process of forming the black matrix region 154 is the same as that of forming the blue transmission region 151, the red transmission region 152, and the green transmission region 153. In other words, a thin film forming process such as a sputtering method or an evaporation method can be applied to form the black matrix region 154. Therefore, an additional piece of equipment just for forming the black matrix is not necessary, which helps to lower the cost.

(2) The optical interference filter 100 of the first embodiment is a multilayer type optical interference filter formed with use of a photonic crystal technique. Therefore, color separation can be performed by changing the film thickness of only the low refractive index composite layer 106 that serves as a spacer layer. As a result, differences in film thickness among the blue transmission region 151, the red transmission region 152, and the green transmission region 153 are small, and the largest difference in film thickness among the above-described regions is 0.133 μm.

Compared to the value 0.8 μm as the largest difference in film thickness in a conventional optical interference filter, the above-described value 0.133 μm has decreased in 83.7%. Therefore, the possibility of occurrence of color mixing is low.

Note that each of the effects of the above-described (1) and (2) is respectively attributed to the fact that (A) the black matrix region 154 that prevents visible light from being transmitted is formed between each adjacent regions among the blue transmission region 151, the red transmission region 152, and the green transmission region 153, and to the fact that (B) the optical interference filter 100 has a structure that can adjust the spectral characteristic by changing the film thickness of only the multilayer type optical interference filter, namely, the spacer layer that is formed with use of a photonic crystal technique and thus the structure is simplified. However, as long as the optical interference filter 100 has either one of the structures (A) and (B), the color mixing can be prevented. Therefore, the optical interference filter 100 may only have one of the structures (A) and (B).

Second Embodiment

Figure 5A:
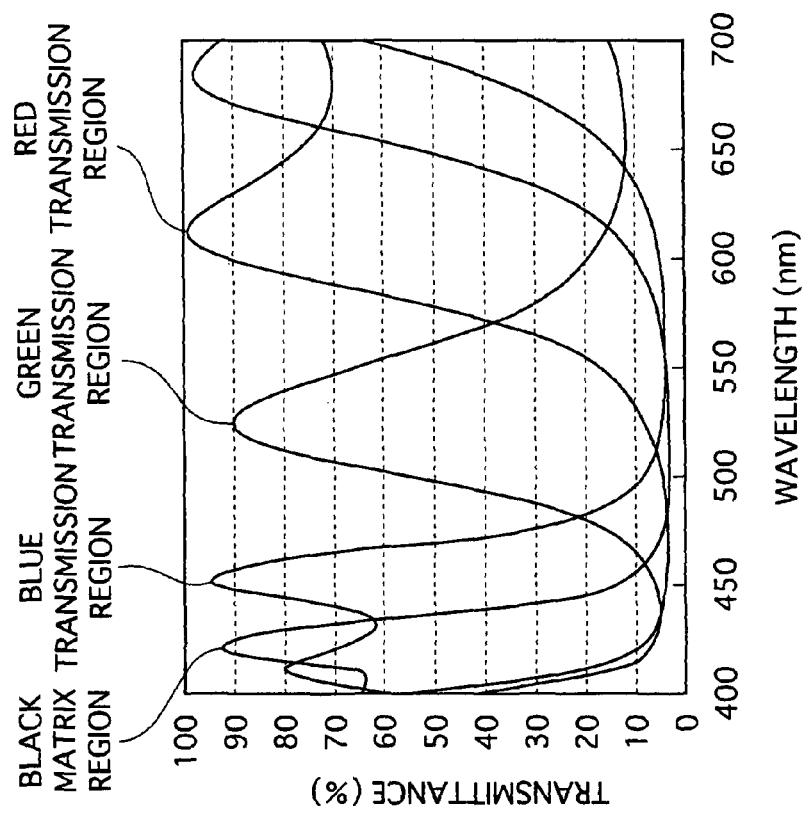
FIG. 5A is a partial sectional view showing an optical interference filter according to a second embodiment of the present invention.

FIG. 5A is a diagram showing an optical interference filter 200 according to a second embodiment of the present invention.

The optical interference filter 200 is a multilayer type optical interference color filter formed with use of the photonic crystal technique, and separates colors of red, green, and blue, as is the case with the optical interference filter 100.

The difference between the optical interference filters 100 and 200 is that the optical interference filter 100 includes only one spacer layer for the color separation while the optical interference filter 200 of the second embodiment includes two spacer layers and the optical film thickness of high refractive index layers and low refractive index layers excluding the above-described two spacer layers is substantially the same.

In other words, the optical interference filter 200 has the same structure as the optical interference filter 100 except the one spacer layer that has been added newly. Also, the forming method of each layer of the optical interference filter 200 is the same as that of the optical interference filter 100.

Specifically, the optical interference filter 200 is formed such that, on the transparent substrate 101, the first high refractive index layer 103, the first low refractive index layer 104, the second high refractive index layer 105, a low refractive index composite layer 226 as a first spacer layer, a third high refractive index layer 232, a second low refractive index layer 233, a fourth high refractive index layer 234, a low refractive index composite layer 235 as a second spacer layer, a fifth high refractive index layer 236, and a third low refractive index layer 237 are stacked on each other in the stated order.

Figure 5B:
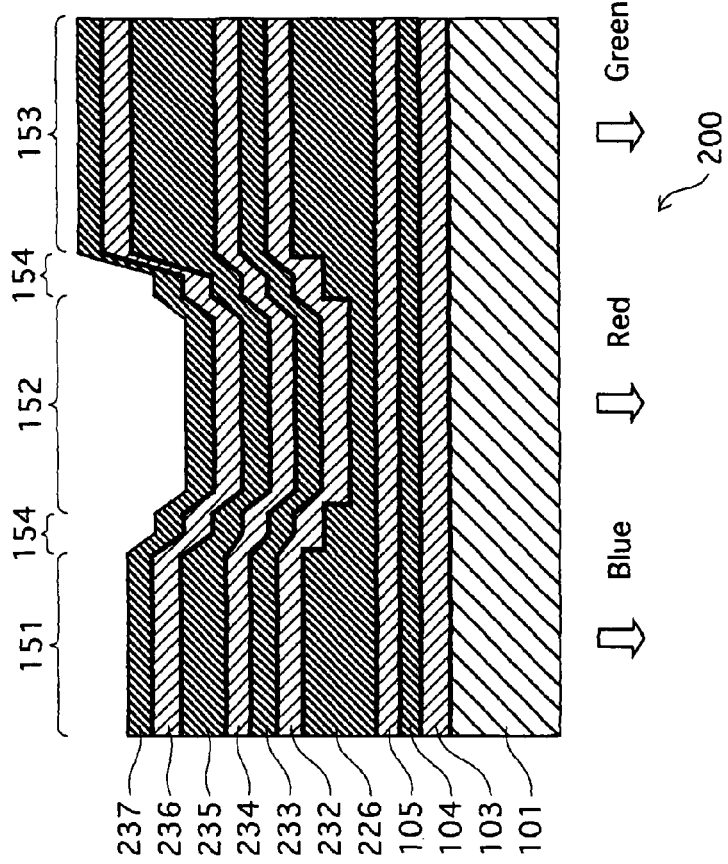
FIG. 5B is a diagram showing a spectral characteristic of the optical interference filter according to the second embodiment.

FIG. 5B is a diagram showing a spectral characteristic of the optical interference filter 200 according to the second embodiment.

In the optical interference filter 100, as shown in FIG. 2, the transmission bandwidth of the blue transmission region is narrower than that of the green transmission region or that of the red transmission region. However, in the optical interference filter 200, as shown in FIG. 5B, the transmission bandwidth of the blue transmission region has increased.

Also, in the optical interference filter 200, the lower limit of the transmission wavelength in each of the blue transmission region, green transmission region, and the red transmission region is smaller than the lower limit thereof in each of the corresponding regions in the optical interference filter 100.

More specifically, as shown in FIG. 5B, transmittance of light having a waveband centered around a wavelength of 550 nm is 4% in the blue transmission region of the optical interference filter 200. However, in the optical interference filter 100, transmittance thereof is 10% as shown in FIG. 2.

In other words, the transmittance of light having a waveband that is not desired to be transmitted has decreased in the optical interference filter 200.

Also, in the black matrix region of the optical interference filter 200, transmittance of light within a visible spectrum is smaller that that of the optical interference filter 100. Therefore, light blocking performance as a black matrix has improved.

As described above, in a case that a multilayer optical interference filter is formed as a black matrix, a structure having two spacer layers can further decrease transmittance of incident light having a wavelength in a range from 450 nm to 650 nm. Also, a reflection characteristic with respect to visible light, and the functionality as a black matrix can be further improved.

(Applications)

The following are descriptions regarding the application of the optical interference filters of the present embodiments to display devices.

(1) Application to Liquid Crystal Display

Figure 6:
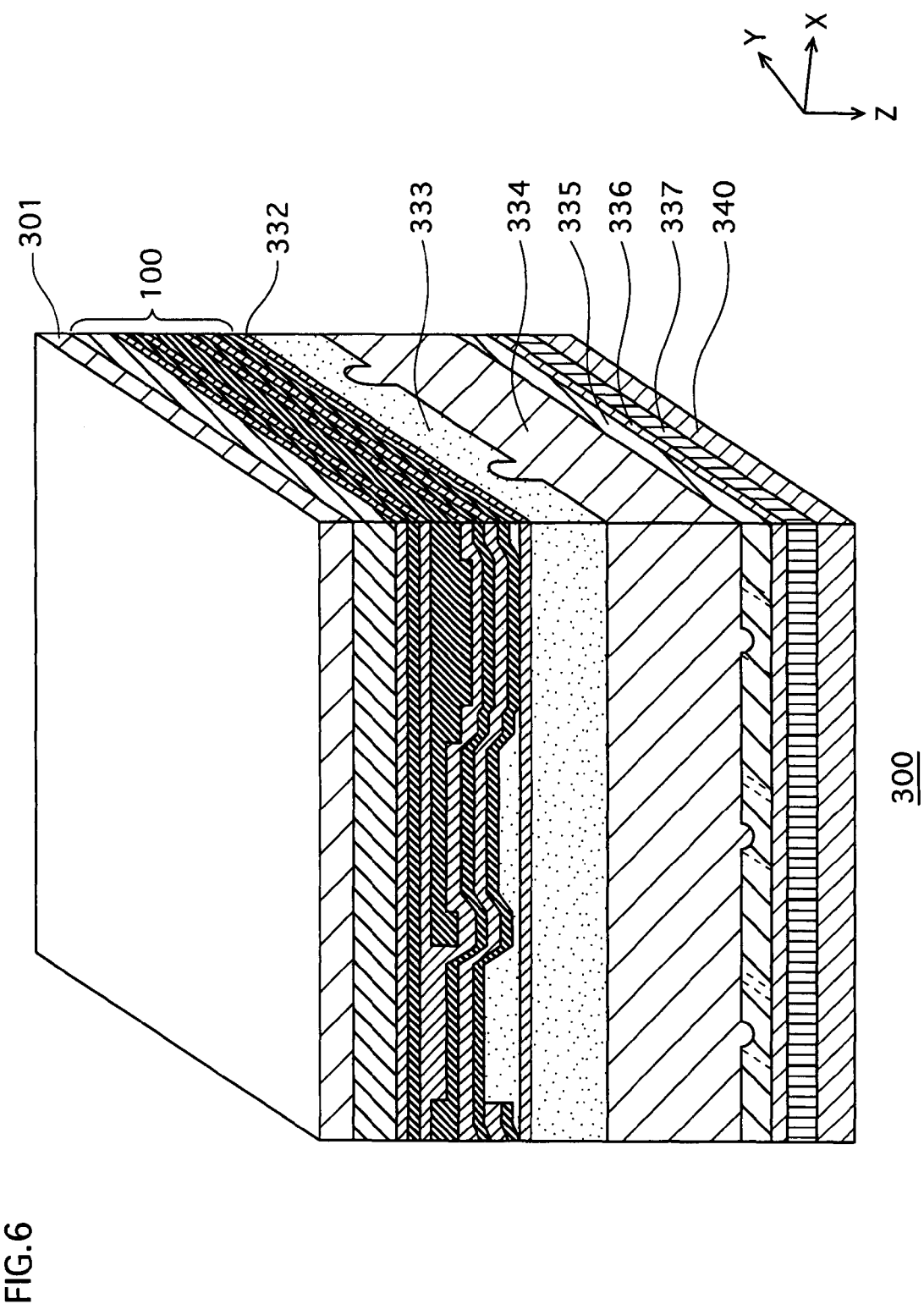
FIG. 6 is a partial sectional perspective view of a liquid crystal display having the optical interference filter of the first embodiment.

FIG. 6 is a partial sectional perspective view in a case that the optical interference filter 100 of the first embodiment is applied to a liquid crystal display.

A liquid crystal display 300 is a display device that converts image data into electric signals, and based on the signals, produces a light-transmitting state and a light-shielding state using transistors that are each disposed in a small pixel of a liquid crystal layer, thereby displaying images. In order to display images, a white light source such as a white LED is used. Therefore, creating a color image requires a color filter.

As the above-described color filter, the optical interference filter 100 of the first embodiment or the optical interference filter 200 of the second embodiment can be used for the liquid crystal display 300.

The following describes a case when the optical interference filter 100 is used.

More specifically, the liquid crystal display 300 is a liquid crystal device that displays characters and images. Assume here that a polarizing plate 301 whose polarization direction is parallel to the X axis in FIG. 6 is the top-most layer. In this case, below the top-most layer, there are the optical interference filter 100 in which the transparent substrate 101 faces upward, a transparent electrode 332 in a form of a sheet, an oriented plate 333 whose orientation direction is parallel to the X axis, a liquid crystal layer 334, an oriented plate 335 whose orientation direction is parallel to the Y axis, a transparent electrode 336, a polarizing plate 337 whose polarization direction is parallel to the Y axis, and a backlight plate 340 including a white LED (not shown in figure), which are laminated on each other in the Z-axis direction in the figure.

As is generally well known, there are two types of drive systems for this liquid crystal display 300. One is an active matrix drive system using a switching device such as TFT (Thin Film Transistor), and the other is a multiplex drive system. Either one of the two systems can be selected to be used for the liquid crystal display 300.

As described above, when the optical interference filter 100 of the first embodiment is applied to a liquid crystal display, color separation can be performed by changing film thickness of only the part of dielectric layers. Therefore, the difference in film thickness between each of the pixels becomes considerably small. Furthermore, a black matrix region arranged between the pixels virtually blocks visible light. Therefore, color mixing caused by oblique light can be prevented.

(2) Application to Plasma Display Panel

The optical interference filter 100 of the first embodiment or the optical interference filter 200 of the second embodiment can be applied to a plasma display panel (hereinafter referred to as "PDP").

The following describes a PDP 400 to which the optical interference filter 100 is applied.

Generally, a PDP does not require a color filter since a phosphor arranged in each of the discharge cells emits light having a red, green, or blue color.

However, in a phosphor that is originally supposed to emit red color, if light emitted from the phosphor includes a wavelength other than a red element, light emitted from the phosphor can be removed by the filter, thereby extracting only the pure red color. In this way, the color reproducibility can be improved.

In other words, application of the optical interference filter 100 of the first embodiment or the optical interference filter 200 of the second embodiment to a PDP is advantageous.

Types of color filters include, for example, a pigment dispersed color filter that is formed such that a pigment is applied to an organic film. However, the optical interference filter 100 of the first embodiment is formed of an inorganic material only. Therefore, the optical interference filter 100 has high heat resistance, and has an advantageous effect that even though the optical interference filter 100 undergoes a baking process in a manufacturing process of a PDP, the quality of the filter is not deteriorated.

Therefore, the optical interference filter 100 can be arranged in the vicinity of a phosphor that is a source of luminescence.

Figure 7:
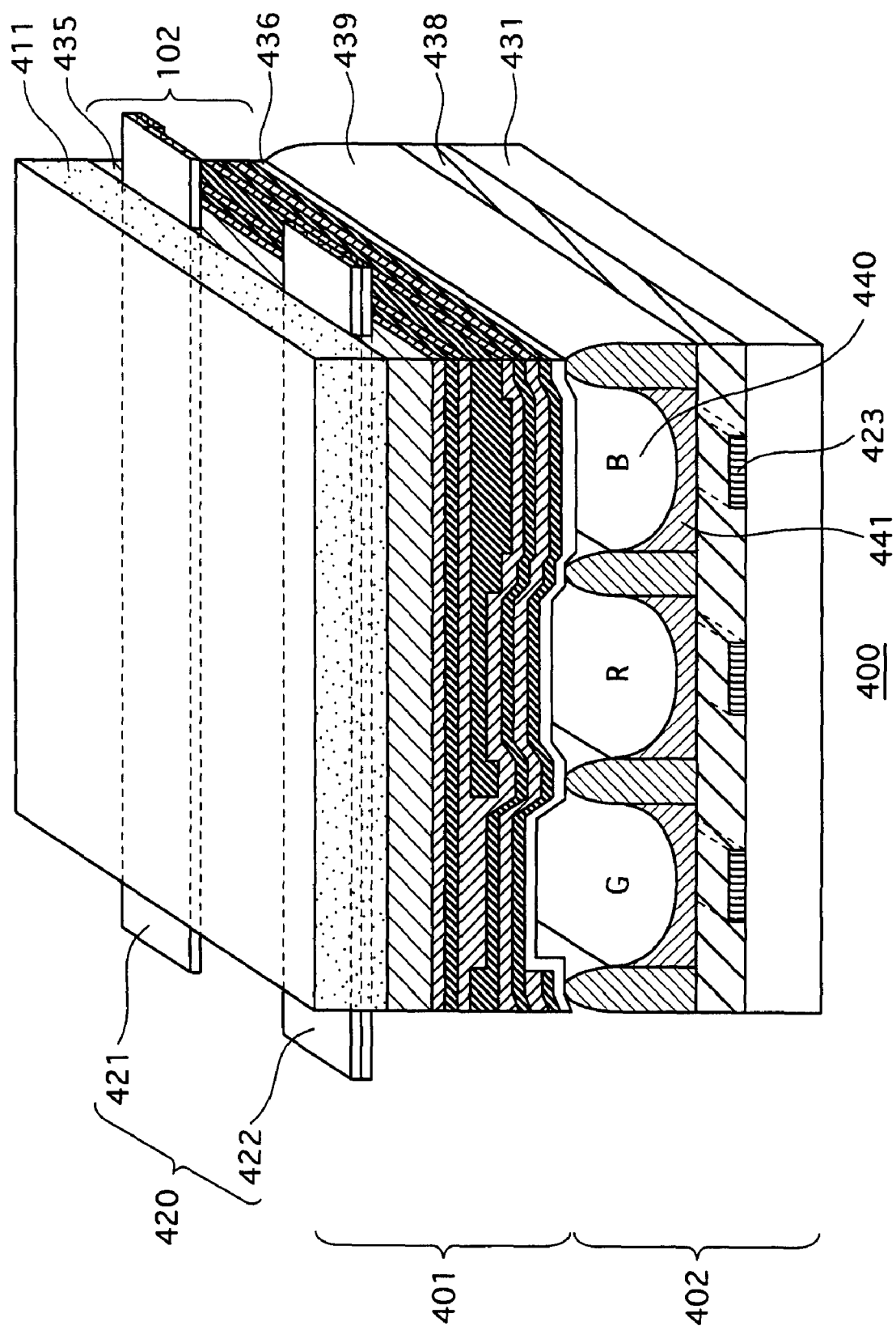
FIG. 7 is a partial sectional perspective view of a surface discharge AC-type plasma display panel having the optical interference filter of the first embodiment.

FIG. 7 shows a structure in which the optical interference filter 100 of the first embodiment is applied to a surface discharge AC-type PDP 400.

The PDP 400 includes a front panel 401 and a back panel 402 sandwiching a discharge space 440.

The front panel 401 includes display electrode pairs 420 constituted from a scan electrode 421 and a sustain electrode 422 formed in stripes on the main surface of the front glass substrate 411 facing the discharge space 440, a dielectric layer 435 formed so as to cover these electrode pairs, and also the total multilayer 102 of the first embodiment and a protective layer 436 successively laminated on the dielectric layer 435.

In other words, in the optical interference filter 100 of the first embodiment, the total multilayer 102 is laminated on the transparent substrate 101. However, in the PDP 400, the total multilayer 102 is formed on the dielectric layer 435.

The above-described structure does not affect the drive of the PDP since the total multilayer 102 is formed of a transparent inorganic material, which means that the total multilayer 102 is dielectric and the total film thickness is thin.

The back panel 402 includes band-shaped data electrodes 423 arranged so as to three-dimensionally intersect the display electrode pairs 420 on the main surface of a back glass substrate 431 facing the discharge space, and a dielectric layer 438 laminated so as to cover the data electrodes 423.

On the main surface of the dielectric layer 438 facing the discharge space, barrier ribs 439 are formed in stripes, and the red, green, and blue phosphors of the phosphor layers 441 are continuously arranged in the stated order on the surface of the dielectric layer 438 and on the side walls of the barrier ribs 439.

The protective layer 436 in the front panel 401 prevents deterioration on the surface of the display electrode pair 420. The deterioration occurs because of sputter etching caused by the bombardment of energetic ions generated during discharge.

The protective layer 436 has, for example, Magnesium Oxide as a major component, and contributes to lower firing voltage by effectively emitting secondary electrons in the discharge space.

The front panel 401 and the back panel 402 that are formed as described above are arranged such that the machined surfaces of the panels face each other, and sealed at the outer periphery. Then, after atmospheric air and impurity gas remaining between the panels have been exhausted through an exhaust opening (not shown in figure), the discharge space between the panels is filled with a discharge gas such as Xenon-Neon based rare gas, or Xenon-Helium based mixed gas. Finally, the exhaust opening is sealed to complete the PDP 400.

As described above, in a PDP, the total multilayer 102 of the optical interference filter 100 of the first embodiment is arranged in the vicinity of a phosphor, thereby extracting only a desired color while suppressing color mixing.

Note that, as described above, the total multilayer 102 does not always need to be arranged in the vicinity of a phosphor, namely, on the dielectric layer 435. Instead, the total multilayer 102 may be arranged on the main surface of the glass substrate 411 facing the side opposite to the discharge space 440.

Also, in FIG. 7, the optical interference filter 100 includes the blue transmission region 151, the red transmission region 152, the green transmission region 153 that respectively transmit blue, red and green color, and, the black matrix region 154. However, the blue transmission region 151, the red transmission region 152, and the green transmission region 153 may all be set as regions that transmit white light, namely, as regions that transmit all of the blue, red, and green colors. Then, only the black matrix region 154 may have the same spectral characteristic as it is.

This is because, when only the black matrix region 154 is arranged in the vicinity of a phosphor, color mixing can be prevented more effectively.

(3) Application to Organic Electroluminescence Display

The optical interference filter 100 of the first embodiment or the optical interference filter 200 of the second embodiment may be applied to an organic electroluminescence display.

Figure 8:
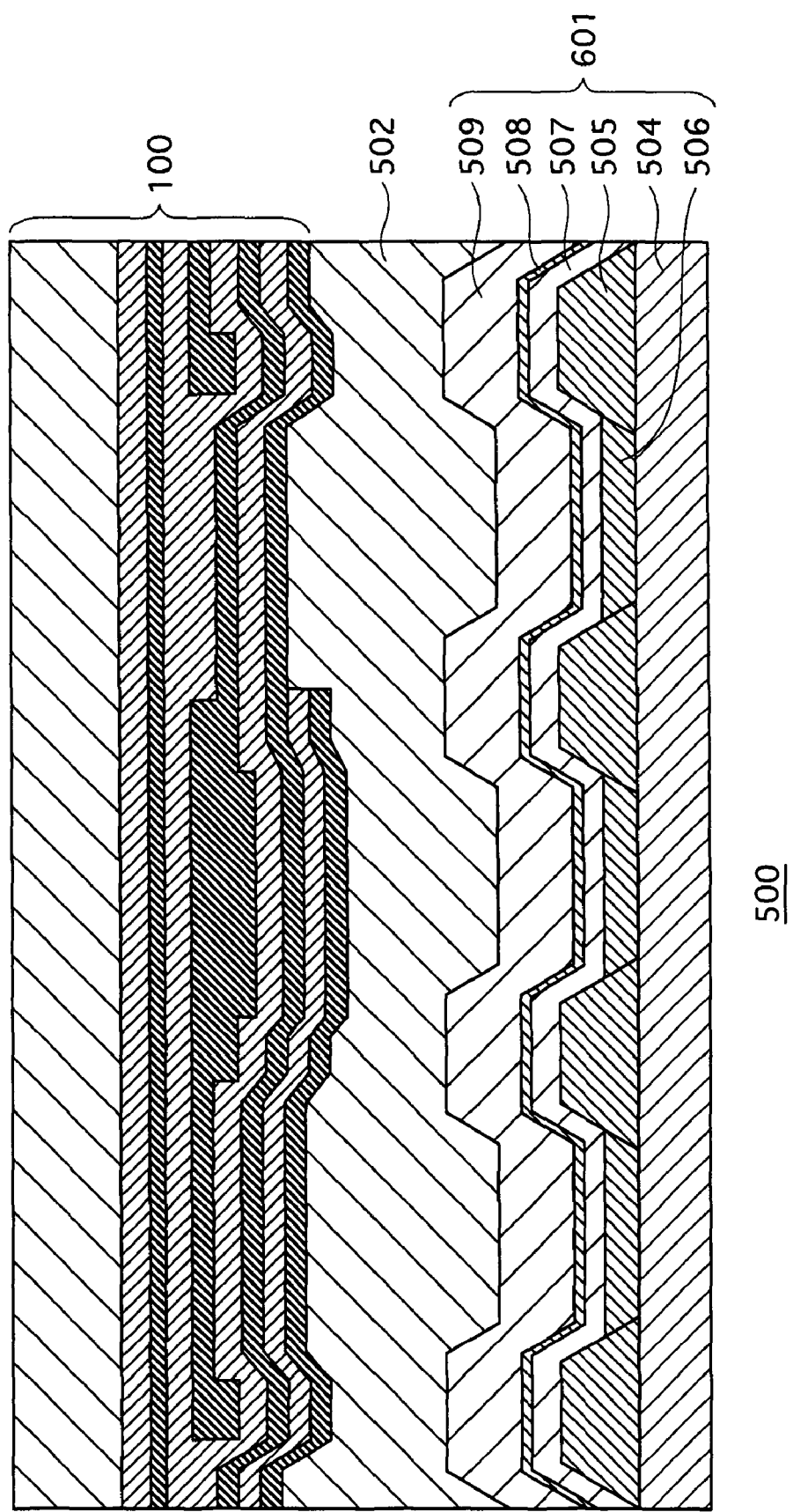
FIG. 8 is a partial sectional perspective view of an organic electroluminescence display having the optical interference filter of the first embodiment.

FIG. 8 is a partial sectional perspective view of an organic electroluminescence display (hereinafter referred to as organic EL display) to which the optical interference filter 100 of the first embodiment is applied.

An organic EL display 500 is formed such that an organic light-emitting device 601 that is self luminous, and the optical interference filter 100 that only transmits each light having a specific wavelength are arranged in opposition to sandwich a sealing layer 502 therebetween.

The optical interference filter 100 is arranged in a state that one of the main surfaces of the transparent substrate 101 faces outward, and the total multilayer 102 faces inward.

The sealing layer 502 fills an inner space sandwiched between the optical interference filter lob and an organic light-emitting device 601, thereby preventing the penetration of oxygen, moisture and such from outside, and also preventing reflection caused at the boundary with the organic light-emitting device 601. Also, the sealing layer 502 effectively transmits light emitted from the organic light-emitting device 601 to the optical interference filter 100.

A material of the sealing layer 502 needs to have visible light transmittance and a refractive index in a range of 1.3-2.5. For example, the material may be an organic material such as transparent silicon rubber, transparent silicon gel, epoxy resin, and acrylic resin.

The organic light-emitting device 601 is formed such that, on a TFT substrate 504 of which a plurality of thin-film transistors (hereinafter referred to as TFT) covered with planarized insulation films (not shown in figure) are dispersed on one of the main surfaces, a spacer layer 505 is formed in a lattice pattern so as to surround the TFT. Then, in each lattice, an anode 506 in a shape of a film is formed. Furthermore, an organic layer 507 including a luminescent layer that emits white light, a cathode 508, and a protective layer 509 are successively stacked in the stated order so as to cover the above-described components that are formed.

The anode 506 is formed of, for example, a transparent conductive metallic oxide layer.

As described above, the optical interference filter 100 of the first embodiment is applied to an organic EL display to prevent color mixing.

Also, pigment dispersed conventional color filters have a problem of time inconsistency that occurs in color selectivity of a color filter. The problem is caused by heat generated from a luminescent layer. However, the multilayer type optical interference color filter of the present invention, which is formed of an inorganic material, has also realized a significant improvement in heat resistance.

(4) Application to Micromirror Device

Thin-model projection display apparatuses presently come in several types in view of weight reduction, size reduction, and usability. For example, there are a transmission type liquid crystal panel (hereinafter referred to as "LCD"), a reflection type liquid crystal panel (hereinafter referred to as "LCOS"), and a DLP (a registered trademark of Texas Instruments Inc. in Texas, U.S.A.: digital light processing) using a so-called DMD (a registered trademark of Texas Instruments Inc. in Texas, U.S.A.: digital micromirror device) that is a semiconductor on which ultramicroscopic reflecting mirrors are arranged.

The application of the optical interference filters according to the first or the second embodiment of the present embodiment to the above-described transparent type liquid crystal panel and the above-described reflection type liquid crystal panel is the same as the above-described (1) application to the liquid crystal display. Therefore, the description thereof is omitted. The following describes a case in which the optical interference filter of the first or the second embodiment of the present embodiment is applied to a digital micromirror device (hereinafter referred to as DMD).

Figure 9:
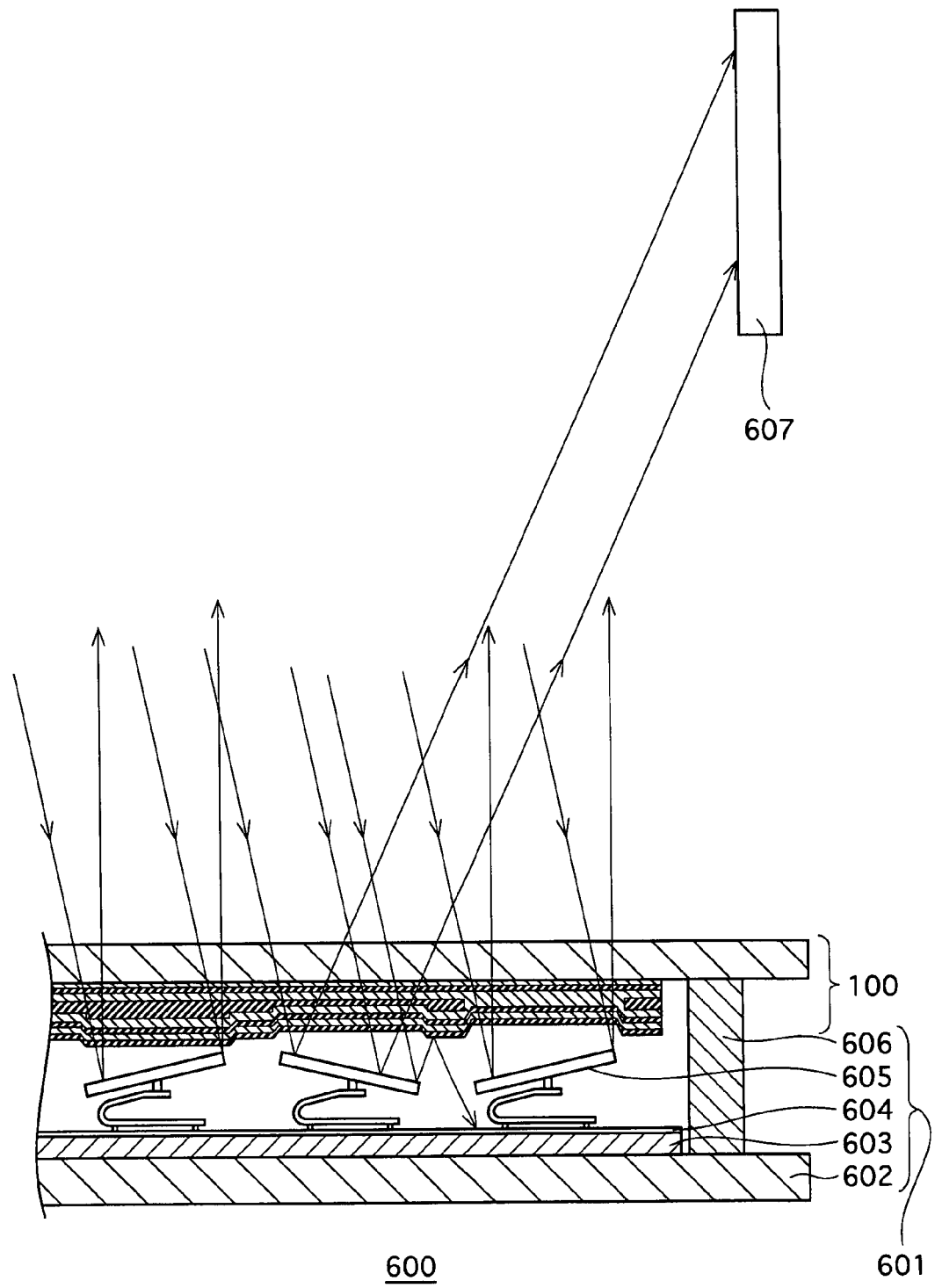
FIG. 9 is a partial sectional perspective view of a digital micromirror device having the optical interference filter of the first embodiment.
Figure 10:
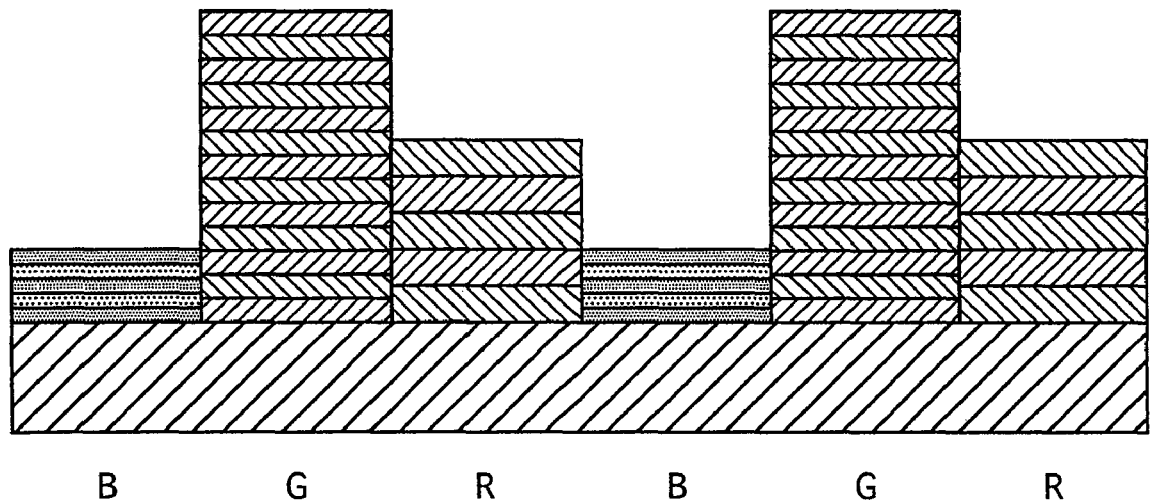
FIG. 10 is a diagram showing the structure of a conventional color filter.

FIG. 9 is a diagram showing an example of when the optical interference filter 100 of the first embodiment is applied to a DMD. Note that the optical interference filter 200 of the second embodiment can be replaced with the optical interference filter 100.

A DMD 600 is formed as follows. First, a CMOS substrate 603 is formed on a supporting substrate 602. On the surface of the CMOS substrate, a light absorption film 604 that absorbs light is formed. Furthermore, on the light absorption film 604, mirror units 605 having mirrors that tilt due to the effect of the electrostatic field are arranged. Then, the optical interference filter 100 of the first embodiment is fixed, in a manner that the side of the transparent substrate 101 faces upward, to the supporting substrate 602 using supporting units 606 so as to cover the mirror units 605.

Also, in a case that the pixel display of the DMD is turned off, a light absorption plate 607 that absorbs light is provided in the reflected light path of the mirror unit 605 corresponding to the pixel.

In the case that the pixel display of the DMD is turned on, a projecting lens (now shown in figure) is provided in the reflected light path of the mirror 605 corresponding to the pixel so that an image can be displayed on a screen (not shown in figure).

As described above, when the optical interference filter 100 of the first embodiment is applied to a DMD, high contrast can be obtained more easily and also color mixing caused by oblique light can be prevented. Furthermore, a multilayer optical interference filter having high heat resistance and high light resistance can be realized.

(Application to Other Devices)

Other than the display devices that are described above, the optical interference filters 100 and 200 of the first and the second embodiments of the present invention can also be applied to a vacuum fluorescent display (VFD), a display using a light emitting diode (LED), a field emission display (FED), and a color display such as an electronic paper.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A liquid crystal display comprising:
   a luminous unit which emits light including visible light;
   a liquid crystal layer having a plurality of first window regions whose states are each selectively switched between a light-transmitting state that transmits light emitted from the luminous unit and a light-shielding state that shields the light; and
   an optical interference film member having a plurality of second window regions arranged over the plurality of first window regions and one or more boundary regions existing between adjacent second window regions, wherein:
   the optical interference film member includes:
   first and second $\lambda/4$ multilayers, $\lambda$ being of a wavelength that is substantially in a center of an overall distribution range of wavebands transmitted through the plurality of second window regions, each of the $\lambda/4$ multilayers including a plurality of dielectric layers whose optical film thickness is $\lambda/4$ each, and
   a first spacer layer whose optical film thickness is different from $\lambda/4$, the first spacer layer being sandwiched between the $\lambda/4$ multilayers.

2. The liquid crystal display according to claim 1, further comprising:
   a third $\lambda/4$ multilayer, each of which includes a plurality of dielectric layers whose optical thickness is $\lambda/4$ each; and
   a second spacer layer whose optical thickness is different from $\lambda/4$, the second spacer layer being sandwiched between the second and third $\lambda/4$ multilayers.

3. The liquid crystal display according to claim 1, wherein a waveband of light that is transmitted through each of the second window regions corresponds to any one of light colors red, given and blue, and a waveband of light that is transmitted through the boundary region substantially belongs to an invisible spectrum excluding a visible spectrum.

4. The liquid crystal display according to claim 1, wherein the optical thickness of the first spacer layer in the first window regions is determined so as to transmit a waveband that substantially belongs to a visible spectrum, and the optical thickness of the first spacer layer in the boundary region is determined so as to transmit a waveband that substantially belongs to an invisible spectrum excluding a visible spectrum.

* * * * *